(12) United States Patent
Lee (10) Patent No.: US 10,868,274 B2
(45) Date of Patent: Dec. 15, 2020

(54) DISPLAY APPARATUS INCLUDING COVER WITH FLEXIBLE PORTION AND METHOD OF MANUFACTURING THE SAME

(71) Applicant: Samsung Display Co., Ltd., Yongin-si (KR)

(72) Inventor: Youngmyung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/932,990

(22) Filed: Jul. 20, 2020

(65) Prior Publication Data

US 2020/0350515 A1 Nov. 5, 2020

Related U.S. Application Data

(63) Continuation of application No. 16/509,655, filed on Jul. 12, 2019.

(30) Foreign Application Priority Data

Nov. 6, 2018 (KR) ........................ 10-2018-0135328

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 27/3244* (2013.01); *H01L 51/56* (2013.01); *H01L 2251/5338* (2013.01)

(58) Field of Classification Search
CPC combination set(s) only.
See application file for complete search history.

(56) References Cited

U.S. PATENT DOCUMENTS

| 7,948,574 | B2 * | 5/2011 | Chen ................. G02F 1/133308 |
| | | | 349/58 |
| 8,680,539 | B2 | 3/2014 | Shim et al. |
| 9,104,368 | B2 * | 8/2015 | Ka ........................ G06F 3/0412 |
| 9,414,463 | B2 * | 8/2016 | Ka .......................... G06F 3/041 |
| 9,637,665 | B2 | 5/2017 | Shim |
| 9,985,246 | B2 | 5/2018 | Jeong et al. |
| 10,114,422 | B2 | 10/2018 | Lee et al. |
| 10,367,164 | B2 * | 7/2019 | Ahn ....................... G06F 1/1616 |
| 10,616,972 | B2 * | 4/2020 | Ka ...................... H01L 27/3276 |

(Continued)

FOREIGN PATENT DOCUMENTS

| KR | 1020150061791 A | 6/2015 |
| KR | 1020160086514 A | 7/2016 |

(Continued)

*Primary Examiner* — Lisa Lea-Edmonds
(74) *Attorney, Agent, or Firm* — Cantor Colburn LLP (57) ABSTRACT

A display apparatus includes a display panel which displays an image; and a cover on a first surface of the display panel. The cover includes a flexible member, and a rigid member which has less flexibility than the flexible member, the flexible member and the rigid member respectively being portions of a same layer on the first surface of the display panel. One member among the flexible member and the rigid member defines a cavity therein, and the other member among the flexible member and the rigid member is disposed in the cavity.

15 Claims, 5 Drawing Sheets

(56) References Cited

U.S. PATENT DOCUMENTS

| | | | | |
|---|---|---|---|---|
| 2010/0124040 A1* | 5/2010 | Diebel | .................. | H05K 13/00 |
| | | | | 361/816 |
| 2012/0162876 A1* | 6/2012 | Kim | .................. | H04M 1/0237 |
| | | | | 361/679.01 |
| 2012/0320498 A1* | 12/2012 | Yow | ....................... | H05K 5/068 |
| | | | | 361/679.01 |
| 2012/0320501 A1* | 12/2012 | Ackloo | ................. | G06F 1/1626 |
| | | | | 361/679.01 |
| 2014/0002385 A1* | 1/2014 | Ka | ........................ | H05B 33/22 |
| | | | | 345/173 |
| 2015/0023030 A1* | 1/2015 | Tsukamoto | ............ | G06F 1/1626 |
| | | | | 362/419 |
| 2017/0229665 A1 | 8/2017 | Park et al. | | |
| 2019/0012028 A1* | 1/2019 | Park | ...................... | G06F 1/1652 |
| 2020/0144538 A1* | 5/2020 | Lee | ..................... | H01L 51/5253 |

FOREIGN PATENT DOCUMENTS

| | | |
|---|---|---|
| KR | 101720588 B1 | 3/2017 |
| KR | 1020170093311 A | 8/2017 |
| KR | 1020180029172 A | 3/2018 |

\* cited by examiner

DISPLAY APPARATUS INCLUDING COVER WITH FLEXIBLE PORTION AND METHOD OF MANUFACTURING THE SAME

This application is a continuation application of U.S. application Ser. No. 16/509,655 filed on Jul. 12, 2019, which claims priority to Korean Patent Application No. 10-2018-0135328, filed on Nov. 6, 2018, and all the benefits accruing therefrom under 35 U.S.C. § 119, the disclosure of which is incorporated herein in its entirety by reference.

BACKGROUND

1. Field

One or more embodiments relate to a display apparatus and a method of manufacturing the same. More particularly, one or more embodiments relate to a display apparatus in which a structure of a cover installed on a surface of a display panel is enhanced, and a method of manufacturing the display apparatus.

2. Description of the Related Art

Generally, a display apparatus such as an organic light-emitting display apparatus or a liquid-crystal display apparatus has a structure in which a front surface and a rear surface of a display panel in a region thereof where an image is implemented, are protected by a window and a cover, respectively.

SUMMARY

Although a cover of a display apparatus has both proper rigidity and flexibility to protect a display panel of the display apparatus from external shock, there is a limitation in that a single material may not have such two different characteristics. In addition, when several covers respectively having different single characteristics are stacked on each other with in a display apparatus, a total thickness of the display apparatus may be undesirably increased. Thus, for a display apparatus having the several covers stacked on each other, realizing a relatively slim display apparatus may be difficult.

Accordingly, one or more embodiments include a display apparatus including a cover that has both rigidity and flexibility in a same layer, for protecting a display panel while the display apparatus is kept relatively thin, and a method of manufacturing the display apparatus.

Additional features will be set forth in part in the description which follows and, in part, will be apparent from the description, or may be learned by practice of the presented embodiments.

According to one or more embodiments, a display apparatus includes a display panel which displays an image is implemented; and a cover on a first surface of the display panel. The cover includes a flexible member, and a rigid member which has less flexibility than the flexible member, the flexible member and the rigid member respectively being portions of a same layer on the first surface of the display panel. One member among the flexible member and the rigid member defines a cavity therein, and the other member among the flexible member and the rigid member is disposed in the cavity.

The rigid member may define the cavity and the flexible member may be disposed in the cavity of the rigid member. A planar shape of the cavity of the rigid member may be defined by a first arc having a radius of curvature, a second arc which faces the first arc and has a radius of curvature different from the radius of curvature of the first arc, a pair of first lines respectively extending from opposing ends of the first arc and toward the second arc, and a pair of second lines connecting ends of the pair of first lines which are closest to the second arc, to opposing ends of the second arc, respectively.

The flexible member may include an upper flexible member and a lower flexible member respectively arranged at opposing ends of the display panel, and a center flexible member arranged between and spaced apart from the upper flexible member and the lower flexible member. The rigid member may define the cavity and the center flexible member may be disposed in the cavity of the rigid member.

The radius of curvature of the first arc may be smaller than the radius of curvature of the second arc.

A virtual line connecting a center of the first arc to a center of the second arc may be parallel with the pair of first lines.

A ratio of a planar area of the rigid member to a total planar area of the cover may be about 30% or less.

The flexible member may include a foam material.

The rigid member may include one of polyethylene terephthalate ("PET") and rigid plastic.

The display apparatus may further include a window through which the image is viewable, the window disposed on a second surface of the display panel which is opposite to the first surface thereof, and a polarizing member disposed between the window and the second surface of the display panel.

According to one or more embodiments, a method of manufacturing a display apparatus includes providing a display panel which displays an image and providing a cover on a first surface of the display panel. The providing the cover includes calculating for a total planar area of the cover, a combination of a flexible planar area at which the cover is flexible and a rigid planar area at which the cover has less flexibility than at the flexible planar area, for which a natural frequency of the display apparatus is maximized, by employing a topology optimization design using a finite element method. Corresponding to the combination of the flexible planar area and the rigid planar area, the method includes providing a flexible member of the cover, and a rigid member of the cover which has less flexibility than the flexible member thereof, and attaching the flexible member and the rigid member to the first surface of the display panel. The flexible member and the rigid member are portions of a same layer on the first surface of the display panel.

The attaching the flexible member may include attaching an upper flexible member and a lower flexible member to opposing ends of the display panel, respectively, and attaching a center flexible member between the upper flexible member and the lower flexible member and spaced apart from both the upper flexible member and the lower flexible member.

The providing the rigid member may include defining a cavity in the rigid member. The attaching the flexible member may dispose the center flexible member in the cavity of the rigid member, and the rigid member between the upper flexible member and the center flexible member and between the lower flexible member and the center flexible member.

A planar shape of the cavity may be defined by a first arc having a radius of curvature, a second arc which faces the first arc and has a radius of curvature different from the radius of curvature of the first arc, a pair of first lines respectively extending from opposing ends of the first arc and toward the second arc, and a pair of second lines connecting ends of the pair of first lines which are closest to the second arc, to opposing ends of the second arc, respectively.

The radius of curvature of the first arc may be smaller than the radius of curvature of the second arc.

A virtual line connecting a center of the first arc to a center of the second arc may be parallel with the pair of first lines.

A ratio of a planar area of the rigid member to a total planar area of the cover may be about 30% or less.

The flexible member may include a foam material.

The rigid member may include one of polyethylene terephthalate ("PET") and plastic.

The method may further include providing a window through which the image is viewable, on a second surface of the display panel which is opposite to the first surface thereof, and providing a polarizing member between the window and the second surface of the display panel.

In addition to those described above, other features and effects will become apparent from the following drawings, claims, and detailed descriptions of the present disclosure.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the invention.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

Hereinafter, embodiments will be described in detail with reference to the attached drawings. Like reference numerals in the drawings denote like elements, and thus their descriptions will not be repeated.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being related to another element such as being "connected to" or "coupled to" another layer, region, or component, it may be "directly connected or coupled" to the other layer, region, or component with no intervening elements therebetween, or "indirectly connected to" the other layer, region, or component with intervening elements therebetween. For example, when a layer, region, or component is referred to as being related to another element such as being electrically "connected to" or "coupled to" another layer, region, or component, it may be electrically "directly connected or coupled" to the other layer, region, or component with no intervening elements therebetween, or electrically "indirectly connected to" the other layer, region, or component with intervening elements therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
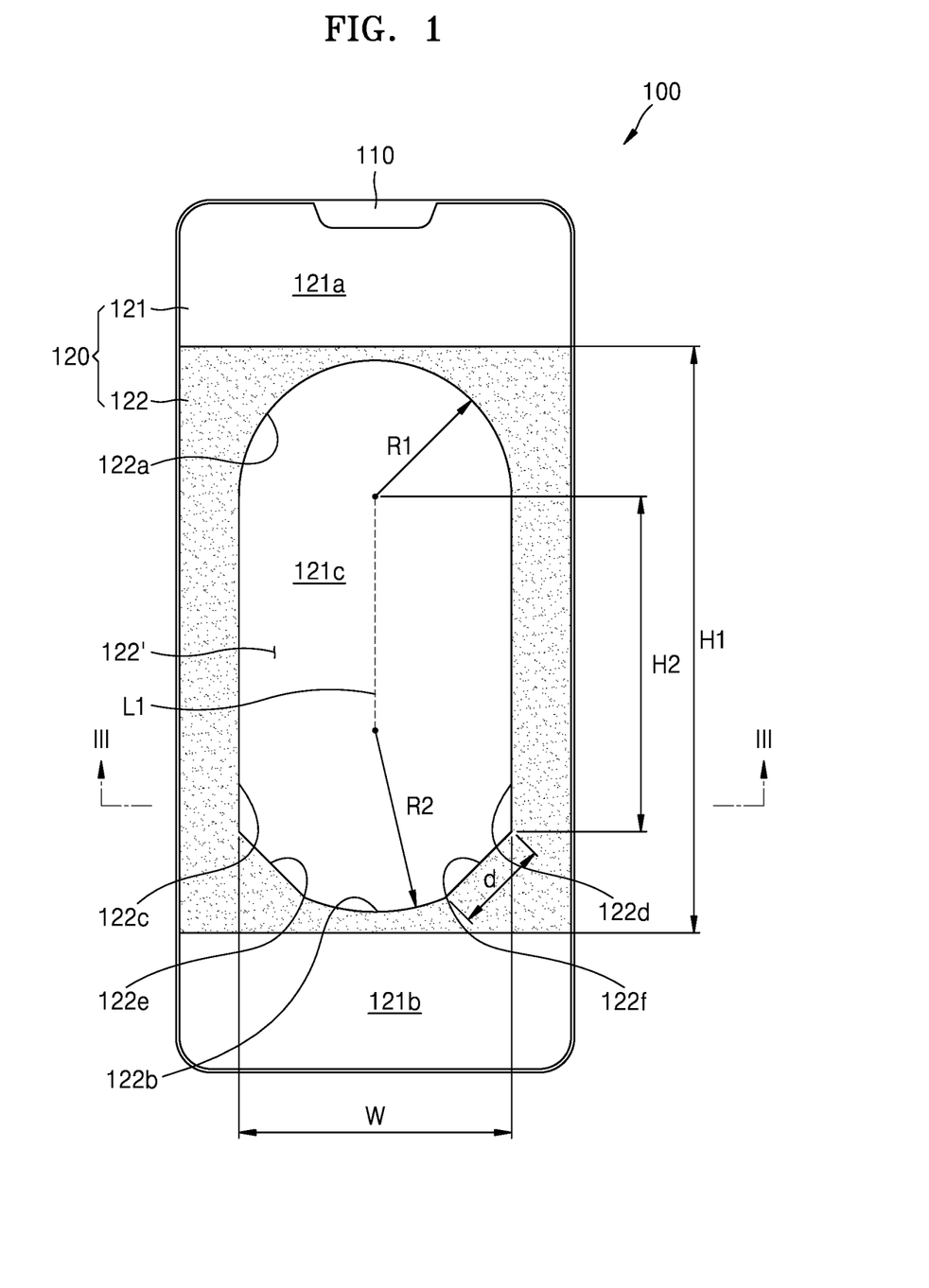
FIG. 1 is a top plan view of an embodiment of a rear surface of a display apparatus.
Figure 2:
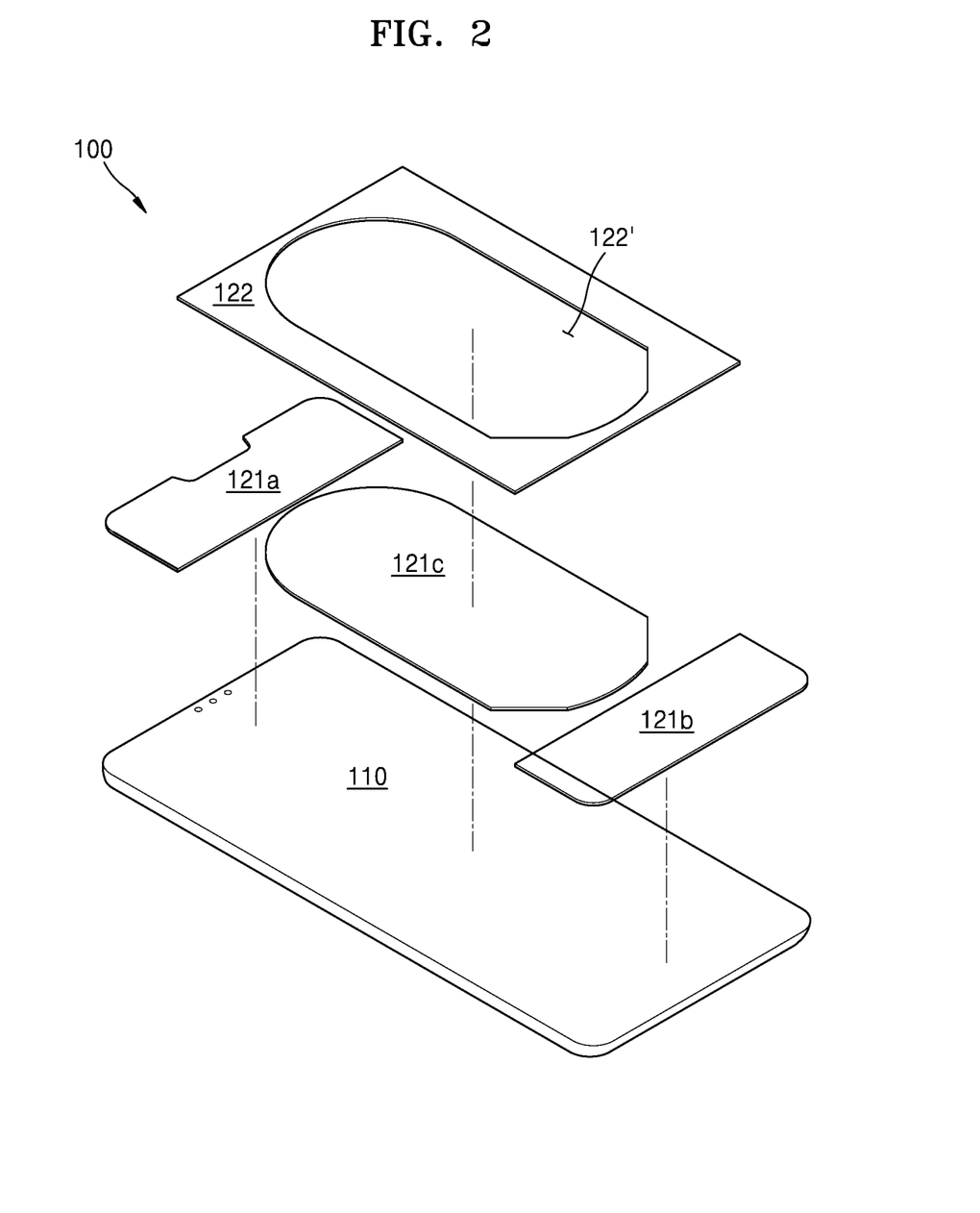
FIG. 2 is an exploded perspective view of the display apparatus of FIG. 1.
Figure 3:
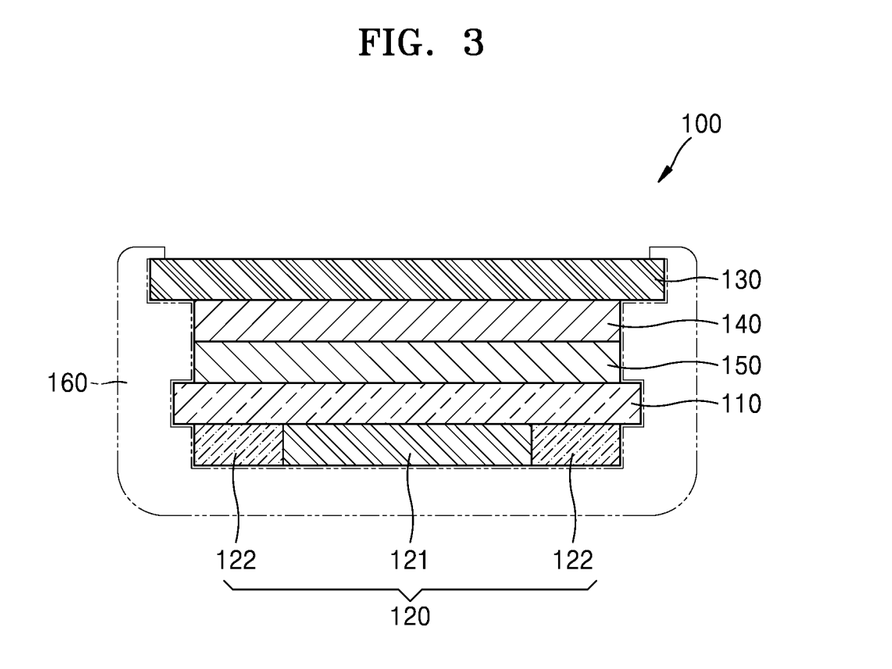
FIG. 3 is a cross-sectional view of the display apparatus taken along line III-Ill of FIG. 1.

FIGS. 1 to 3 illustrate an embodiment of a display apparatus 100.

FIG. 1 is a top plan view of an embodiment of a rear surface of the display apparatus 100. FIG. 2 is an exploded perspective view illustrating individual shapes of respective pieces of a flexible member 121 and a rigid member 122, both constituting a cover 120 of the display apparatus 100. FIG. 3 is a cross-sectional view of the display apparatus 100, taken along line III-III of FIG. 1. In principle, a cross-sectional view of the display apparatus 100 may illustrate that the cover 120 is arranged over a window 130. However, since users view an image via the window 130, for convenience of illustration, FIG. 3 illustrates that the window 130 is arranged over the cover 120.

The display apparatus 100 and components thereof may be disposed in a plane defined by a first direction and a second direction which cross each other. In FIG. 1, the horizontal direction may represent one of the first direction and the second direction, while the vertical direction represents the other one of the first direction and the second direction. A thickness of the display apparatus 100 and components thereof extends along a third direction which crosses each of the first direction and the second direction. In FIG. 3, the horizontal direction may represent the first direction and/or the second direction, while the vertical direction represents a thickness direction.

As shown in the drawings, the display apparatus 100 may have a structure in which the cover 120 is attached to a first surface of a display panel 110, and a polarizing member 150 and the window 130 are attached to a second surface of the display panel 110 which is opposite to the first surface thereof. An image generated and/or displayed by the display panel 110 may be viewable by a user through the window 130, at a viewing side of the display apparatus 100. Elements of the display apparatus 100 other than a surface of the window 130 which is exposed outside the display apparatus 100, are arranged in a case 160. That is, the case 160 may cover all elements of the display apparatus 100 except for the surface of the window 130 which is exposed outside the display apparatus 100. An adhesive resin 140 may be used to attach the polarizing member 150 and the window 130 to each other.

The window 130 covers and protects an upper surface of the display panel 110, that is, a display surface of the display panel 110 at which an image is displayed. The upper surface of the display panel 110 is the second surface of the display panel 110 which is opposite to the first surface thereof. The window 130 may include various types of plastic material, for example, polyamide, polyurethane, silicon, polycarbonate, polyethylene terephthalate ("PET"), polyaramid, polyimide, etc.

Figure 6:
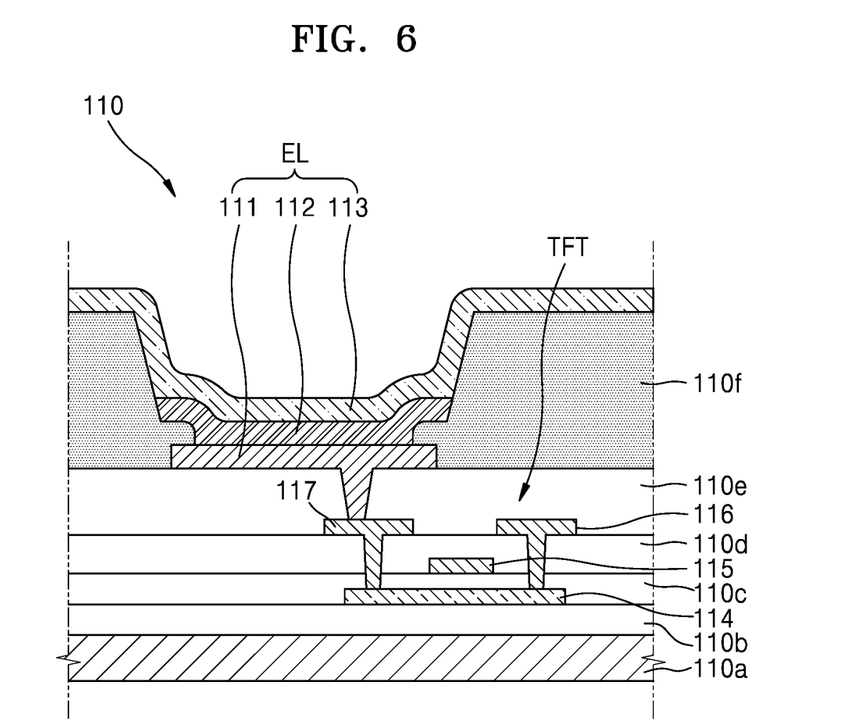
FIG. 6 is a cross-sectional view illustrating an embodiment of an internal structure of a display panel in the display apparatus of FIG. 1.

The display panel 110 is an element of the display apparatus 100 which generates and/or displays an image as described above. In an embodiment, for example, as shown in FIG. 6, the display panel 110 may include an organic light-emitting display apparatus. Referring to the structure shown in FIG. 6, the organic light-emitting display apparatus includes a thin-film transistor TFT and an organic light-emitting diode EL which is controlled by the thin-film transistor TFT to generate and/or emit light for displaying an image.

In the thin-film transistor TFT, an active layer 114 is arranged on a buffer layer 110b, on a substrate 110a. The active layer 114 includes source and drain areas, each doped with a relatively high concentration of an N-type or P-type impurity. The active layer 114 may include an oxide semiconductor. In an embodiment, for example, the oxide semiconductor may include oxide of a material selected from a metal element in Groups 12 to 14 such as zinc (Zn), indium (In), gallium (Ga), stannum (Sn), cadmium (Cd), germanium (Ge), or a combination thereof. In an embodiment, for example, the active layer 114 including an oxide semiconductor may include G-I-Z-O[$(In_2O_3)_a(Ga_2O_3)_b(ZnO)_c$] (where a, b, and c are real numbers, and a≤0, b≤0, and c>0).

Over the active layer 114, a gate electrode 115 is arranged with a gate insulating layer 110c therebetween. Over the gate electrode 115, a source electrode 116 and a drain electrode 117 are arranged. An interlayer insulating layer 110d is arranged between the gate electrode 115 and the source electrode 116, and between the gate electrode 115 and the drain electrode 117. A passivation layer 110e is arranged between the source electrode 116 and a pixel electrode 111, and between the drain electrode 117 and the pixel electrode 111 of the organic light-emitting diode EL.

On the pixel electrode 111, a pixel-defining layer 110f is arranged. The pixel-defining layer 110f defines an opening therein arranged to expose the pixel electrode 111. An emissive layer 112 in the organic light-emitting diode EL is provided on the pixel electrode 111.

The organic light-emitting diode EL emits red, green, and/or blue light according to an electrical current flow, to thereby display certain image information. The organic light-emitting diode EL includes the pixel electrode 111 connected to the drain electrode 117 of the thin-film transistor TFT, an opposite electrode 113 covering the pixel electrode 111, and the emissive layer 112 arranged between the pixel electrode 111 and the opposite electrode 113. The organic light-emitting diode EL may emit light under control of the thin-film transistor TFT. The display apparatus 100 may include a pixel provided in plurality along the substrate 110*a*. Each pixel may include the thin-film transistor TFT and the organic light-emitting diode EL. The opposite electrode 113 may be common to more than one pixel, such as being common to all of the plurality of the pixel.

As a reference, a hole injection layer ("HIL"), a hole transport layer ("HTL"), an electron transport layer ("ETL"), an electron injection layer ("EIL"), etc. may be stacked adjacent to the emissive layer 112 or may form a portion of the emissive layer 112.

Over the opposite electrode 113, a thin-film encapsulation layer (not shown) or an encapsulation substrate (not shown) may be arranged as a protective layer.

The display panel 110 may include, for example, an organic light-emitting display device to implement an image, without being limited thereto.

The cover 120 is installed on a rear surface of the display panel 110 and protects the display panel 110 from an external shock. The rear surface of the display panel 110 is the first surface which is opposite to the second surface of the display panel 110. The cover 120 includes two members having different rigidity or flexibility from each other, but disposed in a same layer as each other among layers of the display apparatus 100 disposed on the display panel 110. That is, the two members of the cover 120 may be disposed at a same distance from the first surface of the display panel 110, to be in a same layer as each other.

Referring to FIGS. 1 to 3, a flexible member 121 and a rigid member 122 are disposed in a same layer of the display apparatus 100. The flexible member 121 and the rigid member 122 are respectively portions of a same layer on the first surface of the display panel 110. A flexibility of the flexible member 121 is relatively higher than a flexibility of the rigid member 122. That is, the cover 120 includes both the flexible member 121 having higher flexibility than the rigid member 122, and the rigid member 122 having higher rigidity than the flexible member 121. The flexible member 121 and the rigid member 122 are respectively provided in different regions of a same layer in the display apparatus 100, instead of being provided in multiple layers or different layers within the display apparatus 100. By doing so, a total thickness of the display apparatus 100 may be minimized and the cover 120 in which rigidity and flexibility are combined with each other may be implemented. The flexible member 121 may include a foam material, and the rigid member 122 may include PET.

As a method of determining planar area regions of the flexible member 121 and the rigid member 122, a solid isotropic material with penalization model ("SIMP") technique for a topology optimization design using a finite element method may be employed. That is, maximization of a natural frequency of the display apparatus 100 with respect to planar areas of the cover 120 is set as an objective function and a density of the cover 120 is set as a design variable. As used herein, "natural frequency" indicates the frequency at which a system tends to oscillate in the absence of any driving or damping force. Then, a design variable for each position along the cover 120 is calculated by using the SIMP technique. Portions of the cover 120 corresponding to top 30% or less of a calculated result are selected as positions in which the rigid member 122 is to be installed. In the SIMP technique, the design variable is calculated as a value in the range from 0 to about 1, and the top 30% of the calculated result corresponds to a value of about 0.7 or greater. As a precondition of the calculation, a ratio of a planar area of the rigid member 122 to a total planar area of the cover 120 is kept to about 30% or less. This is because, empirically, when the total planar area of the rigid member 122 exceeds about 30% relative to a total planar area of the cover 120, rigidity is too high to achieve a proper combination of the rigidity with flexibility within the cover 120 for smooth shock absorption for the display apparatus 100.

Figure 4:
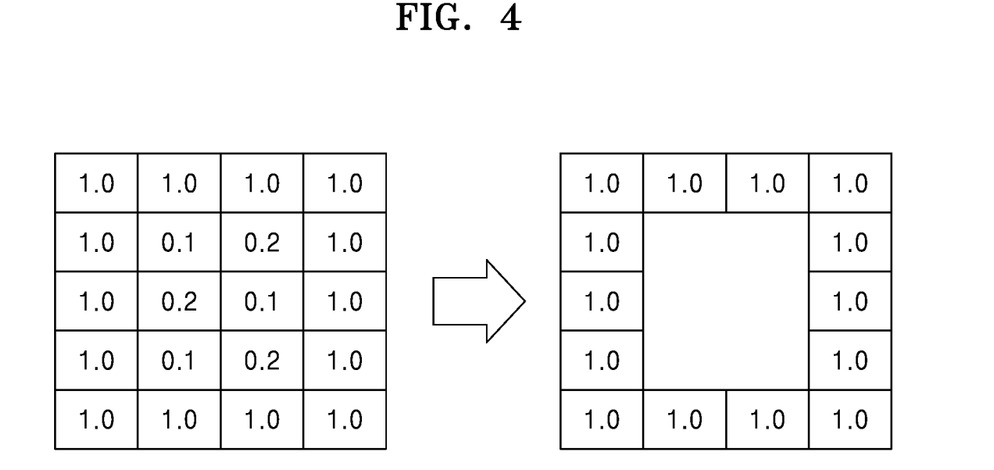
FIG. 4 shows schematic tables for explaining an embodiment of a method of a topology optimization design method of setting a shape of a cover in the display apparatus of FIG. 1.

FIG. 4 shows schematic tables for showing a method of selecting a position in which the rigid member 122 is to be installed by using the SIMP technique for the topology optimization design.

In an embodiment, for example, for a total planar area of the cover 120, a combination of a flexible planar area at which the cover 120 is flexible and a rigid planar area at which the cover 120 has less flexibility than at the flexible planar area is calculated, for which a natural frequency of the display apparatus 100 is maximized, by employing a topology optimization design using a finite element method. Corresponding to the combination of the flexible planar area and the rigid planar area, a flexible member 121 of the cover 120, and a rigid member 122 of the cover 120 which has less flexibility than the flexible member thereof are provided, and the flexible member 121 and the rigid member 122 are then attached to the first surface of the display panel 110 to be disposed in a same layer on the first surface of the display panel 110.

As shown in the left table in the drawing, a total planar area of the cover 120 is divided into planar area sections, and a design variable is calculated for a divided result, that is, the respective planar area sections by using the SIMP technique under the condition described above. Then, planar area regions corresponding to a value greater than 0.7 and planar area regions corresponding to a value less than about 0.7 are obtained where 0.7 refers to the top 30% of the calculated result. Among these planar regions, the planar regions corresponding to a value less than 0.7 are deleted. In an embodiment, the deleted planar regions correspond to regions of the cover 120 in which the flexible member 121 is to be installed. Then, remaining planar regions shown on the right table of FIG. 4 are selected as regions of the cover 120 in which the rigid member 122 is to be installed within the cover 120.

By calculating the design variable by using the method described above, planar shapes and/or dimensions of the flexible member 121 and the rigid member 122 are obtained as shown in FIGS. 1 and 2.

The flexible member 121 includes an upper flexible member 121*a* and a lower flexible member 121*b* arranged at opposing ends of the cover 120, respectively, and a center flexible member 121*c* arranged between the upper flexible member 121*a* and the lower flexible member 121*b* and spaced apart therefrom. The center flexible member 121*c* together with the upper flexible member 121*a* and the lower flexible member 121*b* occupy a planar area of the cover 120 among a total planar area thereof.

With respect to a total planar area of the cover 120, the rigid member 122 fills a remaining planar area of the cover 120, that is, an empty space between the center flexible member 121*c*, the upper flexible member 121*a* and the lower flexible member 121*b* which are spaced apart from each other. At a center of a shape of the rigid member 122 defined by the total planar area of the rigid member 122, a cavity 122' is arranged corresponding to the center flexible member 121*c*. That is, a planar shape of the cavity 122' corresponds to a planar shape of the center flexible member 121*c*.

While a portion of the flexible member 121 is shown disposed in the cavity 122' of the rigid member 122, the invention is not limited thereto. In an embodiment, one member among the flexible member 121 and the rigid member 122 defines a cavity 122' therein, and the other member among the flexible member 121 and the rigid member 122 is disposed in the cavity 122'.

Referring to FIG. 1 in detail, a planar shape of the cavity 122' includes a first arc 122a and a second arc 122b facing each other with respect to the center flexible member 121c. A radius of curvature R1 of the first arc 122a is smaller than a radius of curvature R2 of the second arc 122b, but the exemplary embodiment is not limited thereto, and the radius of curvature R1 may be greater than or equal to the radius of curvature R2. The first arc 122a and the second arc 122b may be portions of a virtual circle which has the radius of curvature R1 and the radius of curvature R2, respectively.

In addition, a pair of first lines 122c and 122d extends from opposing ends of the first arc 122a, respectively, toward the second arc 122b. The pair of first lines 122c and 122d are parallel with a virtual line L1 connecting a center of the first arc 122a to a center of the second arc 122b. The radius of curvature R1 and the radius of curvature R2 are shown extended from the center of the first arc 122a and the center of the second arc 122b, respectively.

In addition, a pair of second lines 122e and 122f connect the pair of first lines 122c and 122d to opposing ends of the second arc 122b, respectively.

As such, the cavity 122' is arranged at the center of the planar shape of the rigid member 122. The cavity 122' has a planar shape defined by the first arc 122a and the second arc 122b connected to the pair of first lines 122c and 122d and to the pair of second lines 122e and 122f. A shape of the center flexible member 121c is also defined by the arcs and lines described above for the shape of the cavity 122'.

The shapes of the cavity 122' and the center flexible member 121c are derived from a result obtained by selecting a location in which the rigid member 122 is installed by using the SIMP technique for the topology optimization design. That is, the cover 120 may be implemented such that a thickness of a display apparatus 100 is kept relatively slim by arranging the flexible member 121 and the rigid member 122 in a same layer, flexibility for absorbing a shock is not excessively reduced as a ratio of a total planar area of the rigid member 122 to a total planar area of the cover 120 is limited to about 30% or less, and rigidity is properly combined with flexibility by maximizing a natural frequency.

As illustrated in FIG. 1, the rigid member 122 is defined by a main body of which portions thereof define the cavity 122'. A length H1 of the main body of the rigid member 122, lengths H2 of each of the pair of first lines 122c and 122d, lengths d of each of the pair of second lines 122e and 122f, a radius of curvature R1 of the first arc 122a, a width W of the cavity 122' and a radius of curvature R2 of the second arc 122b may vary depending on a size of the display apparatus 100.

Figure 5:
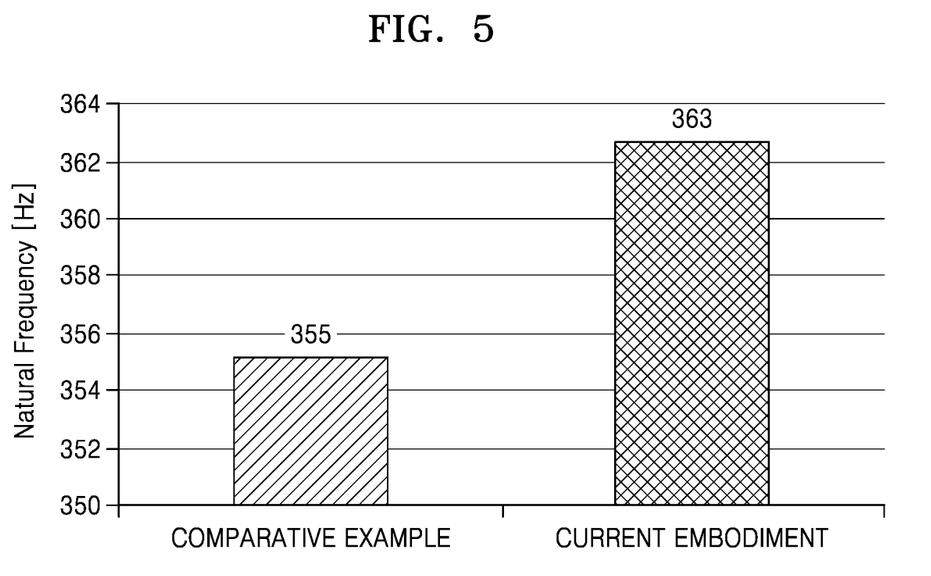
FIG. 5 is a graph showing a degree to which a natural frequency of the display apparatus of FIG. 1 is enhanced relative to a comparative example.

FIG. 5 is a graph showing a degree to which a natural frequency of an embodiment of the display apparatus of FIG. 1 ('CURRENT EMBODIMENT') is enhanced relative to a comparative example ('COMPARATIVE EXAMPLE'). More particularly, FIG. 5 shows a comparison of a result of measuring a natural frequency in hertz (Hz) in an embodiment of the cover 120 of a display apparatus with a result of that of a comparative example. In the comparative example, a cover of a display apparatus includes only a flexible member. As shown in FIG. 5, a natural frequency in the embodiment of the cover 120 is about 8 Hz higher than a natural frequency in the comparative example. This indicates that rigidity in the embodiment of the cover 120 is increased as compared to the rigidity in the cover of the comparative example as including only a flexible member.

Accordingly, as described with reference to the 'CURRENT EMBODIMENT' in FIG. 5, when the cover 120 in which the flexible member 121 and the rigid member 122 are arranged in a same layer according to the topology optimization design is used in a display apparatus 100, the display apparatus 100 may be kept relatively slim and the display panel 110 may be protected by the cover 120 in which rigidity is combined with flexibility. Thus, reliability and stability of the display apparatus 100 may be sufficiently ensured.

In a method of manufacturing a display apparatus including one or more embodiment of the cover 120 such as shown in FIG. 2, the flexible member 121 and the rigid member 122 may be separately provided such as being cut out respectively from a preliminary member for forming the flexible member 121 and the rigid member 122, according to respective shapes of the display panel 110. Then, the separately provided flexible member 121 and the separately provided rigid member 122 may each be attached to a rear surface of the display panel 110.

Figure 7:
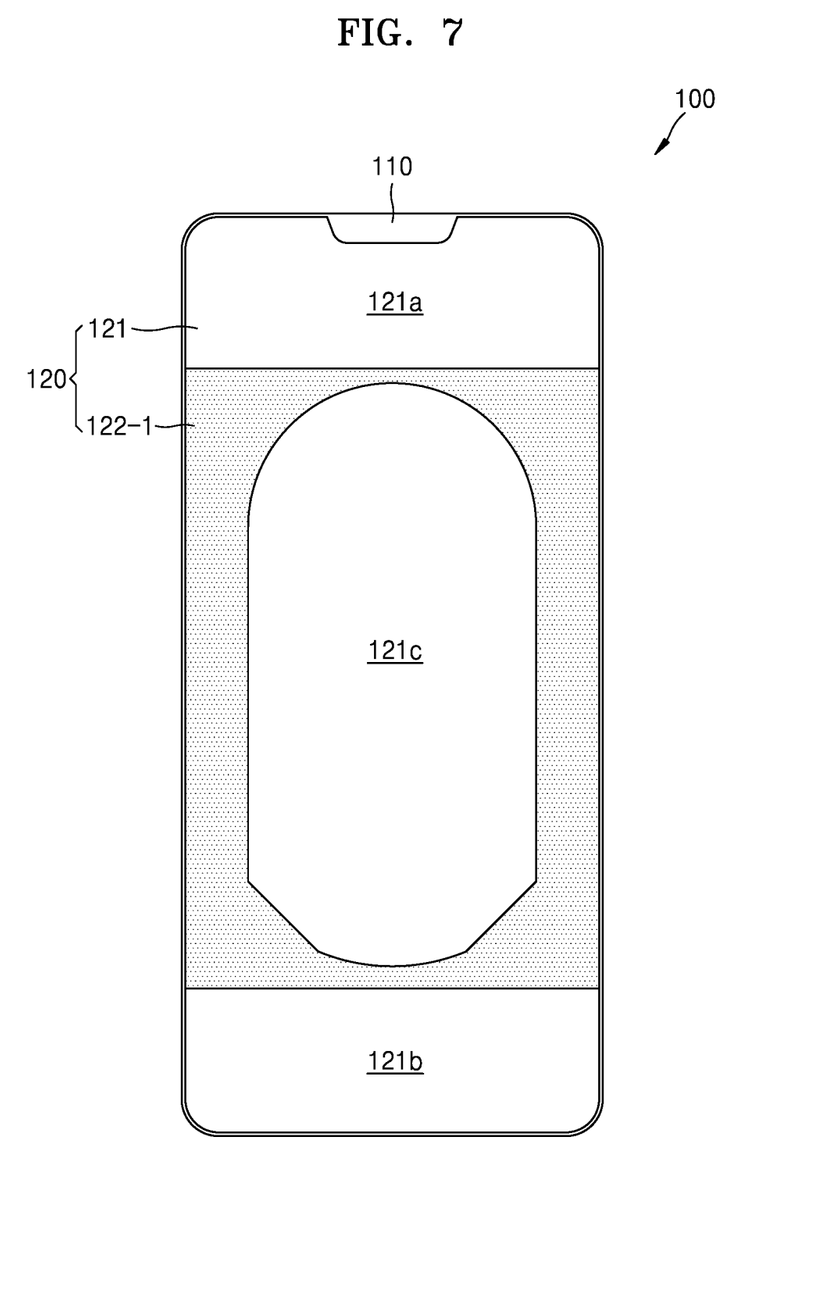
FIG. 7 is a top plan view of another embodiment of a rear surface of a display apparatus.

In the embodiment described above, the rigid member 122 includes PET as an example. However, like an example shown in FIG. 7, a rigid member 122-1 may include a relatively rigid plastic. That is, the rigid member 122 (FIG. 1) and the rigid member 122-1 are not limited to a particular material, and may include any relatively rigid material which can provide the rigid member 122 (FIG. 1) and the rigid member 122-1 as separate members to have a shape shown in the drawings and subsequently attached to a rear surface of the display panel 110.

Accordingly, as described above, in one or more embodiment, a strength of a display apparatus may be effectively enhanced without having to increase a total thickness of the display apparatus. Thus, a highly reliable display apparatus that may be kept relatively rigid and having a minimized thickness may be implemented.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display panel which displays an image; and
   a cover on a first surface of the display panel, the cover comprising:
      a center flexible member, and
      a rigid member which has less flexibility than the center flexible member, the center flexible member and the rigid member respectively being portions of a same layer on the first surface of the display panel,
   wherein
   the rigid member defines a cavity therein, and
   the center flexible member is disposed in the cavity of the rigid member.

2. The display apparatus of claim 1, wherein a planer shape of the cavity of the rigid member is defined by:
   a first arc having a radius of curvature,
   a second arc which faces the first arc and has a radius of curvature different from the radius of curvature of the first arc, a pair of first lines respectively extending from opposing ends of the first arc and toward the second arc, and a pair of second lines connecting ends of the pair of first lines which are closest to the second arc, to opposing ends of the second arc, respectively.

3. The display apparatus of claim 2, wherein the radius of curvature of the first arc is smaller than the radius of curvature of the second arc.

4. The display apparatus of claim 2, wherein a virtual line connecting a center of the first arc to a center of the second arc is parallel with the pair of first lines.

5. The display apparatus of claim 1, wherein a ratio of a planar area of the rigid member to a total planar area of the cover is about 30% or less.

6. The display apparatus of claim 1, wherein the center flexible member comprises a foam material.

7. The display apparatus of claim 1, wherein the rigid member comprises one of polyethylene terephthalate and plastic.

8. The display apparatus of claim 1, further comprising a window through which the image is viewable, the window disposed on a second surface of the display panel which is opposite to the first surface thereof.

9. A display apparatus comprising:
a display panel which displays an image; and
a cover on a first surface of the display panel, the cover comprising:
a flexible member, and
a rigid member which has less flexibility than the flexible member, the flexible member and the rigid member respectively being portions of a same layer on the first surface of the display panel, wherein one member among the flexible member and the rigid member defines a cavity therein, and the other member among the flexible member and the rigid member is disposed in the cavity, wherein a planar shape of the cavity of the one member among the flexible member and the rigid member is defined by:
a first arc having a radius of curvature,
a second arc which faces the first arc and has a radius of curvature different from the radius of curvature of the first arc,
a pair of first lines respectively extending from opposing ends of the first arc and toward the second arc, and
a pair of second lines connecting ends of the pair of first lines which are closest to the second arc, to opposing ends of the second arc, respectively.

10. The display apparatus of claim 9, wherein the radius of curvature of the first arc is smaller than the radius of curvature of the second arc.

11. The display apparatus of claim 9, wherein a virtual line connecting a center of the first arc to a center of the second arc is parallel with the pair of first lines.

12. The display apparatus of claim 9, wherein a ratio of a planar area of the rigid member to a total planar area of the cover is about 30% or less.

13. The display apparatus of claim 9, wherein the flexible member comprises a foam material.

14. The display apparatus of claim 9, wherein the rigid member comprises one of polyethylene terephthalate and plastic.

15. The display apparatus of claim 9, further comprising:
a window through which the image is viewable, the window disposed on a second surface of the display panel which is opposite to the first surface thereof, and
a polarizing member disposed between the window and the second surface of the display panel.

* * * * *